United States Patent
Nagahashi

(10) Patent No.: US 9,581,913 B2
(45) Date of Patent: Feb. 28, 2017

(54) EXPOSURE APPARATUS, EXPOSURE METHOD, METHOD FOR MANUFACTURING DEVICE

(71) Applicant: NIKON CORPORATION, Tokyo (JP)

(72) Inventor: Yoshitomo Nagahashi, Takasaki (JP)

(73) Assignee: NIKON CORPORATION, Tokyo (JP)

( * ) Notice: Subject to any disclaimer, the term of this patent is extended or adjusted under 35 U.S.C. 154(b) by 195 days.

(21) Appl. No.: 14/339,777

(22) Filed: Jul. 24, 2014

(65) Prior Publication Data

US 2014/0333909 A1 Nov. 13, 2014

Related U.S. Application Data

(60) Division of application No. 13/067,463, filed on Jun. 2, 2011, now Pat. No. 8,896,813, which is a division of application No. 11/902,437, filed on Sep. 21, 2007, now Pat. No. 7,973,906, which is a continuation of application No. 11/407,126, filed on Apr. 20, 2006, now Pat. No. 7,643,129, which is a continuation of application No. PCT/JP2004/015619, filed on Oct. 21, 2004.

(30) Foreign Application Priority Data

Oct. 22, 2003 (JP) .................................. 2003-362279

(51) Int. Cl.
G03B 27/42 (2006.01)
G03B 27/52 (2006.01)
G03F 7/20 (2006.01)

(52) U.S. Cl.
CPC ................ *G03F 7/70341* (2013.01)

(58) Field of Classification Search
CPC .. G03F 7/70341; G03F 7/70716; G03F 7/707; G03F 7/7085; G03F 7/2041; G03F 7/70725; G03F 7/70925; G03F 7/70875; G03F 7/70891; G03F 7/70916; G03F 7/70641; G03F 7/70858; G03F 7/20
See application file for complete search history.

(56) References Cited

U.S. PATENT DOCUMENTS 4,346,164 A 8/1982 Tabarelli et al.
4,509,852 A 4/1985 Tabarelli et al.
(Continued)

FOREIGN PATENT DOCUMENTS

DE 221 563 A1 4/1985
EP 1 659 620 A1 5/2006
(Continued)

OTHER PUBLICATIONS

Jul. 4, 2014 Office Action issued in Korean Patent Application No. 2013-7012836 (with translation).
(Continued)

*Primary Examiner* — Mesfin Asfaw
(74) *Attorney, Agent, or Firm* — Oliff PLC

(57) ABSTRACT

An exposure apparatus exposes a substrate via a projection optical system and liquid. The exposure apparatus includes a first pipe section that flows liquid supplied from a liquid supplying device, and a second pipe section that is disposed at an outside of the first pipe section so as to surround the first pipe section and flows liquid supplied from the liquid supplying device.

34 Claims, 6 Drawing Sheets

(56) References Cited

U.S. PATENT DOCUMENTS

| | | | |
|---|---|---|---|
| 5,610,683 | A | 3/1997 | Takahashi |
| 6,427,717 | B1 | 8/2002 | Kimura |
| 7,050,146 | B2 | 5/2006 | Duineveld et al. |
| 7,643,129 | B2 | 1/2010 | Nagahashi |
| 7,948,608 | B2 | 5/2011 | Nagahashi |
| 7,973,906 | B2 | 7/2011 | Nagahashi |
| 2004/0257544 | A1 | 12/2004 | Vogel et al. |
| 2005/0048220 | A1 | 3/2005 | Mertens et al. |
| 2005/0074704 | A1 | 4/2005 | Endo et al. |
| 2005/0078286 | A1 | 4/2005 | Dierichs et al. |
| 2005/0217703 | A1* | 10/2005 | O'Donnell ......... B05C 11/1039 134/21 |
| 2006/0023183 | A1 | 2/2006 | Novak et al. |
| 2006/0176456 | A1 | 8/2006 | Nagasaka et al. |
| 2006/0209282 | A1 | 9/2006 | Arai |
| 2007/0242241 | A1* | 10/2007 | Nagasaka ........... G03F 7/70341 355/30 |

FOREIGN PATENT DOCUMENTS

| | | |
|---|---|---|
| JP | A-04-330961 | 11/1992 |
| JP | A-06-53120 | 2/1994 |
| JP | A-06-168866 | 6/1994 |
| JP | A-06-188169 | 7/1994 |
| JP | A-8-145299 | 6/1996 |
| JP | A-08-166475 | 6/1996 |
| JP | A-08-330224 | 12/1996 |
| JP | A-10-163099 | 6/1998 |
| JP | A-10-214783 | 8/1998 |
| JP | A-10-303114 | 11/1998 |
| JP | A-11-176727 | 7/1999 |
| JP | A-2000-505958 | 5/2000 |
| JP | A-2002-243071 | 8/2002 |
| JP | A-2003-229404 | 8/2003 |
| WO | WO 99/49504 | 9/1999 |
| WO | WO 2004/055803 A1 | 7/2004 |

OTHER PUBLICATIONS

Feb. 15, 2007 Office Action in U.S. Appl. No. 11/407,126.
Oct. 30, 2007 Notice of Allowance in U.S. Appl. No. 11/407,126.
Feb. 17, 2009 Office Action in U.S. Appl. No. 11/407,126.
Sep. 4, 2009 Notice of Allowance in U.S. Appl. No. 11/407,126.
Jun. 9, 2008 Office Action in European Application No. 04 792 768.6.
Jun. 17, 2009 European Search Report in European Application No. 09158917.6.
Jan. 20, 2009 Office Action in Japanese Application No. 2005-514865, with translation.
May 19, 2009 Notice of Allowance in Japanese Application No. 2005-514865, with translation.
Oct. 21, 2009 Communication pursuant to Article 94(3) in European Application No. 04792768.6.
Dec. 14, 2004 International Search Report and Written Opinion in International Application No. PCT/JP2004/015619, with translation.
Dec. 18, 2007 Supplemental European Search Report in European Application No. 04792768.6.
Aug. 9, 2010 Office Action in U.S. Appl. No. 12/379,183.
Jan. 14, 2011 Notice of Allowance in U.S. Appl. No. 12/379,183.
Mar. 18, 2011 Office Action in Korean Application No. 2006-7007676, with translation.
Oct. 16, 2008 Office Action in U.S. Appl. No. 11/902,437.
May 27, 2009 Office Action in U.S. Appl. No. 11/902,437.
Jan. 5, 2010 Notice of Allowance in U.S. Appl. No. 11/902,437.
Mar. 16, 2010 Notice of Allowance in U.S. Appl. No. 11/902,437.
Jul. 9, 2010 Office Action in U.S. Appl. No. 11/902,437.
Feb. 28, 2011 Notice of Allowance in U.S. Appl. No. 11/902,437.
Feb. 22, 2012 Office Action issued in Korean Application No. 2006-7007676 (with English translation).
Nov. 13, 2012 Office Action issued in Korean Patent Application No. 2011-7021891 (with English translation).
Nov. 19, 2012 Office Action issued in Korean Application No. 2012-7022945 (with English translation).
Aug. 28, 2013 Office Action issued in Korean Patent Application No. 2013-7012836 (with translation).
Apr. 29, 2014 Office Action issued in Korean Patent Application No. 2012-7014051 (with translation).
May 16, 2014 Office Action issued in Korean Patent Application No. 2014-7005576 (with translation).
Feb. 1, 2013 Office Action issued in U.S. Appl. No. 13/067,463.
Dec. 9, 2013 Office Action issued in U.S. Appl. No. 13/067,463.
Apr. 14, 2014 Notice of Allowance issued in U.S. Appl. No. 13/067,463.
Mar. 4, 2015 Office Action issued in Korean Application No. 2014-7005576.

* cited by examiner

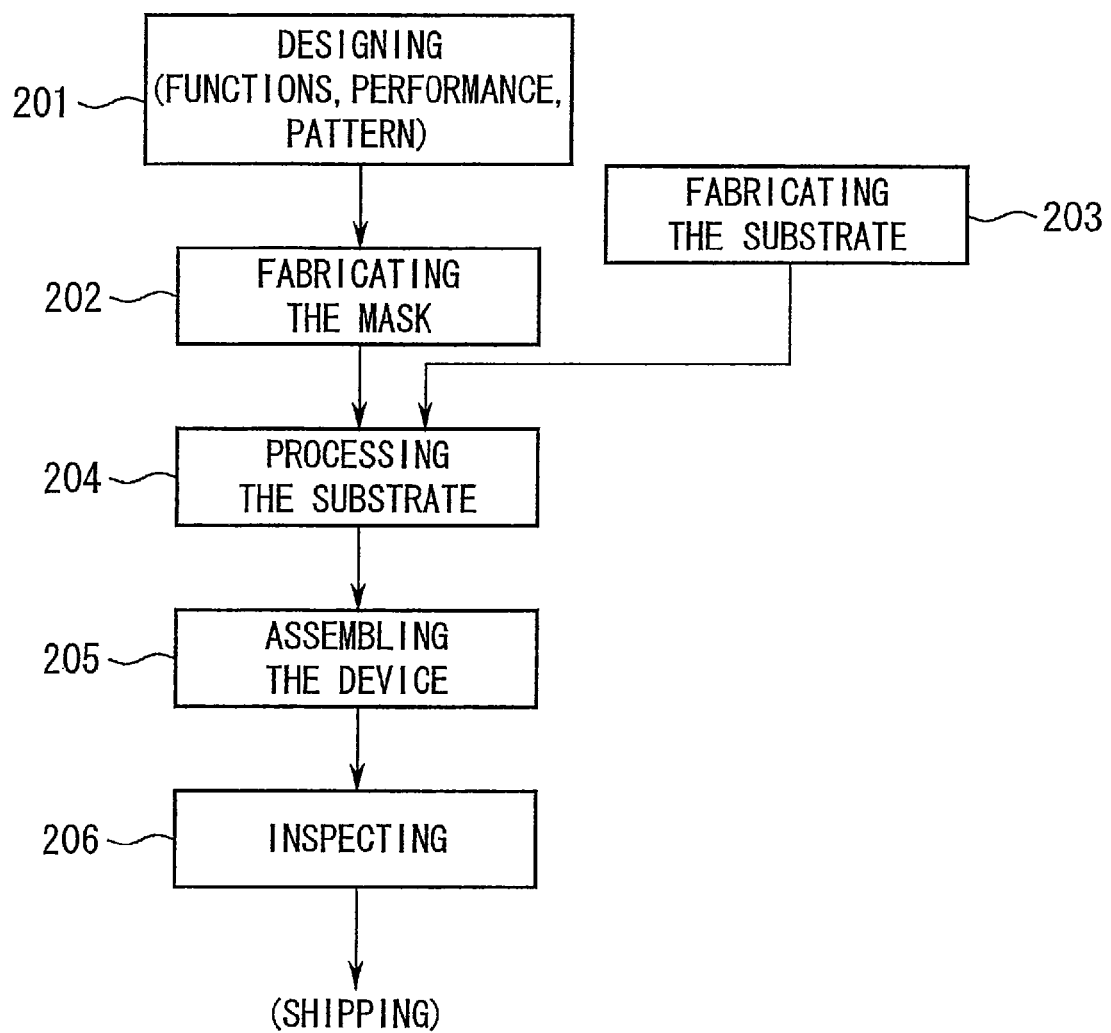

EXPOSURE APPARATUS, EXPOSURE METHOD, METHOD FOR MANUFACTURING DEVICE

CROSS-REFERENCE TO RELATED APPLICATION

This is a Division of U.S. patent application Ser. No. 13/067,463 filed Jun. 2, 2011 (now U.S. Pat. No. 8,896,813), which in turn is a Division of U.S. patent application Ser. No. 11/902,437 filed Sep. 21, 2007 (now U.S. Pat. No. 7,973,906), which is a Continuation of U.S. patent application Ser. No. 11/407,126 filed Apr. 20, 2006 (now U.S. Pat. No. 7,643,129), which is a Continuation of International Application No. PCT/JP2004/015619, filed Oct. 21, 2004, which claims priority on Japanese Patent Application No. 2003-362279 (filed on Oct. 22, 2003). The disclosure of each of the aforementioned applications is incorporated herein by reference in its entirety.

BACKGROUND OF THE INVENTION

Field of the Invention

The present invention relates to a technology with respect to an exposure apparatus that is used in transcription steps of lithographic steps for manufacturing highly-integrated semiconductor circuit elements.

Description of the Related Art

A semiconductor device or liquid crystal display device is manufactured by technique known as photolithography, in which a pattern formed on a mask is transferred onto a photosensitive substrate. The exposure apparatus used in this photolithography process has a mask stage that supports a mask and a substrate stage that supports a substrate, and it transfers a mask pattern onto a substrate via a projection optical system while sequentially moving the mask stage and the substrate stage.

In recent years, there has been a demand for higher resolution of the projection optical system in order to respond to the further advances in terms of higher integration of the device pattern. As the exposure wavelength to be used becomes shorter, the resolution of the projection optical system becomes higher. As the numerical aperture of the projection optical system becomes larger, the resolution of the projection optical system becomes higher. Therefore, the exposure wavelength which is used for the exposure apparatus is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus $\delta$ are represented by the following expressions respectively.

$$R = k_1 \cdot \lambda / NA \quad (1)$$

$$\delta = \pm k_2 \cdot \lambda / NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$, is shortened and the numerical aperture NA is increased in order to enhance the resolution R, then the depth of focus $\delta$ is narrowed.

If the depth of focus $\delta$ is too narrow, it is difficult to match the substrate surface with respect to the image plane of the projection optical system. There is concern that the margin is insufficient during the exposure operation. Accordingly, the liquid immersion method has been suggested, which is disclosed, for example, in PCT International Publication No. WO99/49504 as a method for substantially shortening the exposure wavelength and widening the depth of focus. In this liquid immersion method, the space between the lower surface of the projection optical system and the substrate surface is filled with a liquid such as water or any organic solvent so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

With respect to the water and the organic solvent filled between the lower surface of the projection optical system and the substrate surface, temperature must be controlled strictly. This is because, if the temperature of the liquid varies, the refractive index of the liquid varies; thereby, the wavelength of the exposure light beam varies in the liquid; thus, a defect occurs due to the varied exposure light beam. More specifically, the temperature of the liquid must be controlled to be in a range of ±0.01° C. with respect to a predetermined temperature of the liquid, and the temperature-controlled liquid must be supplied onto the substrate continuously.

However, the temperature of the liquid may be affected by ambient temperature therearound if pipes which supply the liquid from a temperature control device (thermostat reservoir) to liquid-supplying-nozzles are long. Also, if the liquid supply is stopped when a wafer is exchanged, the temperature of the liquid existing in the pipes varies; therefore, there is a problem in that the exposure process cannot be restarted immediately even if the liquid supply is restarted because the temperature of the liquid in the liquid immersion region is not in the above temperature range.

In addition, there is possibility that contaminants may invade the liquid from ports of the pipes. In particular, if the exposure apparatus is stopped for a long time for purposes such as repair and inspection, there is possibility that bacteria will grow in the liquid existing in the pipes. Therefore, there is a problem with respect to not only micro-patterning but also operation of the exposure apparatus.

SUMMARY OF THE INVENTION

The present invention was conceived in view of the above circumstances, and an object thereof is to provide a liquid-immersion exposure apparatus having a liquid-supplying-mechanism, exposure method, and a method for manufacturing devices so as to: restrict temperature of the liquid supplied between the projection optical system and the substrate from varying; and prevent contaminants from invading the liquid.

In the exposure apparatus, the exposure method, and the method for manufacturing devices according to the present invention, the following members are employed in order to overcome the above problems.

A first invention provides an exposure apparatus that: projects pattern images onto a substrate via liquid and an projection optical system, the liquid forming a liquid immersion region between the projection optical system and the substrate; and exposes the substrate, the apparatus having: a liquid-supplying-section that supplies the liquid onto the substrate; a first pipe section that introduces the liquid to the liquid-supplying-section; and a second pipe section, connected to the first pipe section, that collects the liquid, that is not supplied to the liquid-supplying-section from the first pipe section. According to this invention, a greater amount of liquid than that supplied onto the substrate is introduced into the first pipe section, and the rest of the liquid is collected via the second pipe section. Therefore, the liquid does not stop in the pipe sections when, e.g., the wafer is exchanged; thus, the temperature of the liquid hardly varies and contaminants hardly invade into the liquid.

Also, in the exposure apparatus in which at least a portion of the liquid circulates in the first pipe section and the second pipe section, it is possible to prevent the temperature of the liquid from varying and the contaminants from invading into the liquid while minimizing the quantity of liquid-to-be-consumed.

Also, in the exposure apparatus having a thermostat reservoir which: maintains the temperature of the liquid approximately constant; and supplies the liquid to the first pipe section, it is possible to supply the liquid having an approximately constant temperature onto the substrate from the liquid-supplying-section.

Also, in the present invention: the exposure apparatus further has temperature measuring sections that measure the temperature of the liquid supplied onto the substrate; the temperature control sections are disposed at least in one of the first pipe section and the liquid-supplying-section; and the thermostat reservoir controls the temperature of the liquid in accordance with measurement results measured by the temperature measuring sections.

Also, in the exposure apparatus in which the second pipe section is connected to the thermostat reservoir, temperature of the collected liquid is adjusted and reintroduced into the first pipe section. It is possible to supply the liquid having an approximately constant temperature onto the substrate and reduce running costs.

Also, in the exposure apparatus further has a refining device that refines the liquid, it is possible to supply bacterium-free and contaminant-free liquid onto the substrate.

Also, in the exposure apparatus in which the second pipe section is connected to the refining device, and the collected liquid is refined by the refining device, it is possible to eliminate impurities and bacterium from the circulating liquid.

Also, in the exposure apparatus in which the first pipe section and the second pipe section form a double pipe so that the second pipe section is formed around the first pipe section together, the collected liquid flows around the liquid supplied onto the substrate, and the collected liquid serves as a thermal insulating member; therefore, it is possible to restrict variations in the temperature of the supplied liquid.

Also, in the exposure apparatus in which the liquid-supplying-section has an aperture mechanism that adjusts quantity of the liquid supplied onto the substrate, it is possible to adjust the quantity of liquid supplied onto the substrate desirably.

A second invention is an exposure method including steps of: forming a liquid immersion region by supplying the liquid between the projection optical system and the substrate; projecting the pattern images onto the substrate via the supplied liquid and the projection optical system; and exposing the substrate, the method including: flowing the liquid; and supplying at least a portion of the flowing liquid onto the substrate. In this invention, the liquid does not stop in the pipe sections; therefore, the temperature of the liquid hardly varies and impurities hardly invade into the liquid.

In the present invention, the first pipe section, the second pipe section, and the liquid-supplying-sections are connected by three-way-valves.

Also, in the exposure method further including steps of: stopping supplying the liquid onto the substrate; and flowing all the liquid, the liquid does not stop in the pipe sections even if supplying the liquid is stopped when, e.g., the wafer is exchanged. Therefore, the temperature of the liquid hardly varies and impurities hardly invade into the liquid.

Also, in the exposure method further including steps of: collecting the liquid which has not been supplied onto the substrate; controlling the temperature of the collected liquid; and supplying the temperature-controlled liquid, it is possible to minimize quantity of the liquid-to-be-consumed while maintaining the temperature of liquid-to-be-supplied approximately constant by circulating the temperature-controlled liquid.

A third invention is a device-manufacturing method including lithographic steps in which the method uses the exposure apparatus in the lithographic steps according to the first invention. According to this invention, the temperature can be maintained approximately constant, and the impurity-and-bacterium-free liquid is used; therefore, it is possible to manufacture devices having micro-patterns stably.

According to the present invention, the following effects can be realized.

The first invention provides an exposure apparatus that: projects pattern images onto a substrate via liquid and a projection optical system, the liquid forming a liquid immersion region between the projection optical system and the substrate; and exposes the substrate, the apparatus including: a liquid-supplying-section that supplies the liquid onto the substrate; a first pipe section that introduces the liquid to the liquid-supplying-section; and a second pipe section, connected to the first pipe section, that collects the liquid which has not been supplied to the liquid-supplying-section from the first pipe section. By doing this, the liquid does not stop in the pipe sections; therefore, it is possible to prevent the temperature of the liquid from varying and form micro-patterns stably via the liquid disposed in the liquid immersion region. Also, the liquid does not stop; therefore, it is possible to restrict generation of bacterium.

Also, since at least a portion of the liquid circulates in the first pipe section and the second pipe section, it is possible to prevent the temperature of the liquid from varying and impurities from invading while minimizing the quantity of liquid-to-be-consumed. Thus, it is possible to form micro-patterns via the liquid in the liquid immersion region stably and at low cost.

Also, since the exposure apparatus has a thermostat reservoir which: maintains the temperature of the liquid approximately constant; and supplies the liquid to the first pipe section, it is possible to supply the liquid having an approximately constant temperature onto the substrate from the liquid-supplying-section and it is possible to restrict refractive index of exposure light beam from varying.

Also, since the second pipe section is connected to the thermostat reservoir; therefore, it is possible to supply the liquid having an approximately constant temperature onto the substrate while reducing the running cost; and to prevent refractive index of the exposure light beam from varying at low cost.

Also, since the exposure apparatus has the refining device that refines the liquid; therefore, it is possible to supply impurity-free and bacterium-free liquid onto the substrate; and to form micro-patterns via the liquid in the immersion liquid region stably and reliably.

Also, since the second pipe section is connected to the refining device so that the collected liquid is refined in the refining device, it is possible to eliminate impurities and bacterium from the circulating liquid; and to form micro-patterns via the liquid in the immersion liquid region stably, reliably, and at low cost.

Also, since the first pipe section and the second pipe section form a double pipe so that the second pipe section is formed around the first pipe section together, it is possible to restrict the temperature of the supplied liquid from varying by adopting a simple structure, i.e., at a low cost.

Also, since the liquid-supplying-section has the aperture mechanism that adjusts the quantity of liquid supplied onto the substrate, it is possible to adjust the quantity of liquid supplied onto the substrate adequately; and to form micro-patterns stably via the liquid disposed in the liquid immersion region.

The second invention is an exposure method including steps of: forming a liquid immersion region by supplying liquid between a projection optical system and a substrate; projecting pattern images onto the substrate via the liquid and the projection optical system; and exposing the substrate, the method including: flowing the liquid; and supplying at least a portion of the flowing liquid onto the substrate. By doing this, the liquid does not stop in the pipe sections; therefore, the temperature of the liquid hardly varies and impurities hardly invade; thus, micro-patterns can be formed reliably via the liquid disposed in the liquid immersion region.

Also, since the exposure method further includes steps of: stopping supplying the liquid onto the substrate; and flowing all the liquid, the temperature of the liquid hardly varies and impurities hardly invade into the liquid even if supplying the liquid stops so as to exchange wafers, etc. In addition, it is not necessary to: adjust the temperature of the liquid; and eliminate contaminants after exchanging wafers; thus, it is possible to restart the exposure steps immediately after exchanging the wafers.

Also, since the exposure method further includes steps of: collecting the liquid which has not been supplied onto the substrate; controlling the temperature of the collected liquid; and supplying the temperature-controlled liquid, it is possible to minimize the quantity of liquid-to-be-consumed while maintaining the temperature of liquid-to-be-supplied approximately constant; and to form micro-patterns via the liquid disposed in the liquid immersion region stably at low cost.

The third invention is a device-manufacturing method including lithographic steps in which the method uses the exposure apparatus according to the first invention in the lithographic steps. According to this invention, the temperature can be maintained approximately constant, and the impurity-free and bacterium-free liquid is used; therefore, the product yield increases, and it is possible to manufacture devices having micro-patterns stably at low cost.

BRIEF DESCRIPTION OF THE DRAWINGS

FIG. 6 shows steps of manufacturing semiconductor devices.

DETAILED DESCRIPTION OF THE INVENTION

Embodiments of the present invention, e.g., an exposure apparatus, an exposure method, and a method for manufacturing a device, are explained with reference to the drawings as follows.

Figure 1:
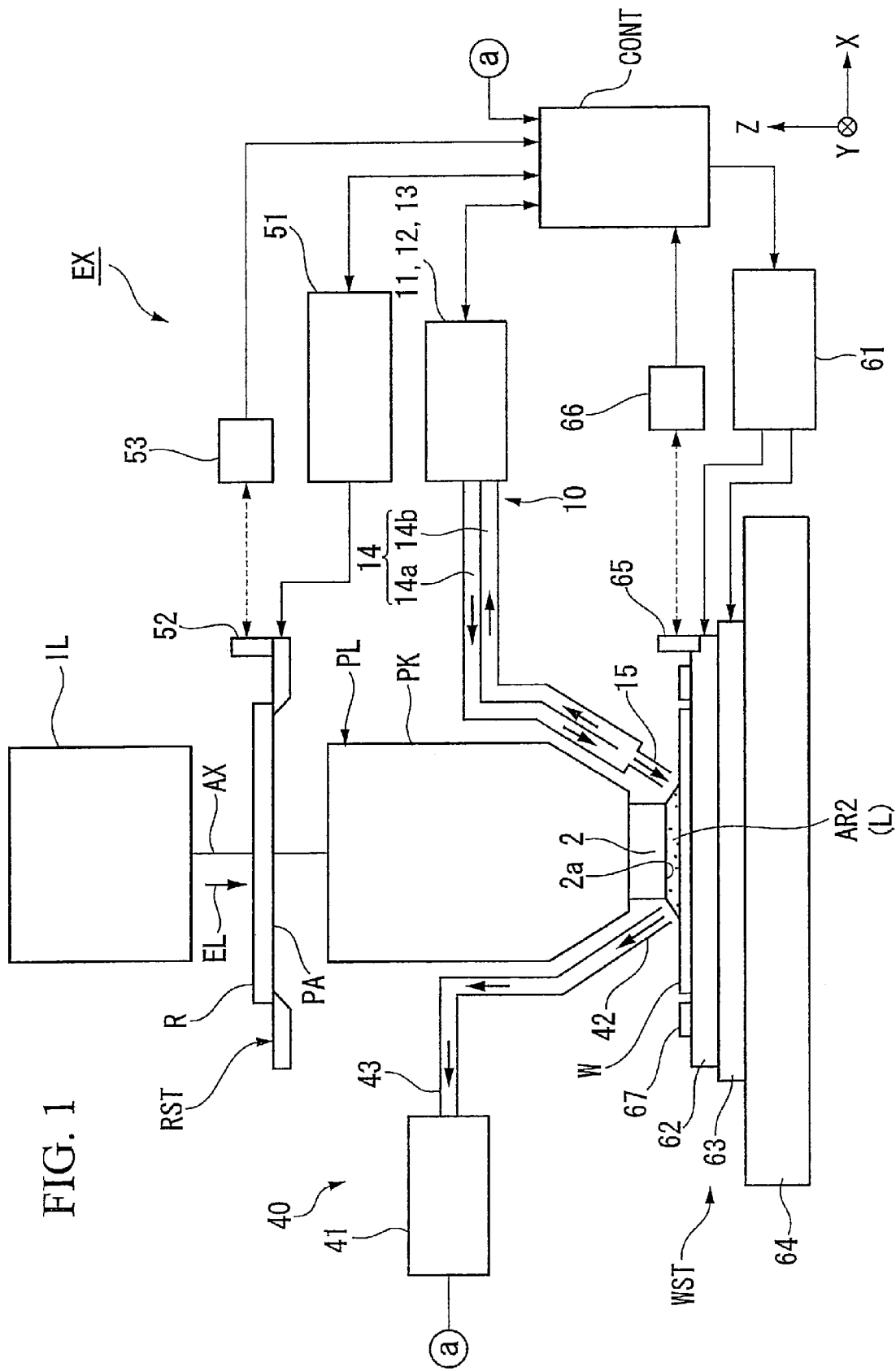
FIG. 1 is a schematic diagram of a general structure of an exposure apparatus.

FIG. 1 is a schematic diagram of a general structure of an embodiment of the exposure apparatus according to the present invention. In FIG. 1, an exposure apparatus EX has: a reticle stage RST that supports a reticle (mask) R having device patterns PA formed thereon; a wafer stage WST that supports a wafer (substrate) having a photosensitive material, e.g., photo-resist formed thereon; an illuminating optical system IL that illuminates a reticle R by emitting an exposure light beam EL; a projection optical system PL that projects pattern (PA) images of the reticle R by illuminating the exposure light beam EL onto the wafer W; and a control device CONT that controls overall operations of the exposure apparatus EX integrally.

In the present embodiment, the exposure apparatus EX is explained with reference to, e.g., a scanning exposure apparatus (so-called a scanning stepper) which exposes the patterns PA, formed on the reticle R, onto the wafer W by moving the reticle R and the wafer W in different (reverse) directions with respect to a scanning direction synchronously. Also, in the following explanations, a Z axis direction indicates a direction coinciding with an optical axis AX of the projection optical system PL. An X axis direction indicates a (scanning) direction in which the reticle R and the wafer W moves synchronously in a plane orthogonal with respect to the Z axis direction. A Y axis direction indicates a (non-scanning) direction orthogonal with respect to the Z axis direction and the X axis direction.

In addition, θX indicates a rotational direction around the X axis. θY indicates a rotational direction around the Y axis. θZ indicates a rotational direction around the Z axis.

Also, the exposure apparatus EX is a liquid immersion exposure apparatus using a liquid immersion method in order to: improve resolution by shortening exposure wavelength substantially; and increase depth of focus substantially. The exposure apparatus EX has: a liquid-supplying-mechanism 10 that supplies the liquid L onto the wafer W; and a liquid-collecting-mechanism 40 that collects the liquid L on the wafer W.

The exposure apparatus EX forms a liquid immersion region AR2 on a part of the wafer W including a projection region AR1 (see FIG. 3) on the projection optical system PL by the liquid L supplied from the liquid-supplying-mechanism 10 while at least transferring the image of the pattern PA of the reticle R onto the wafer W. More specifically, the exposure apparatus EX: fills the liquid L in a space, formed between an optical element 2 and the wafer W, at an tip end (bottom end) of the projection optical system PL; projects the image of the pattern PA of the reticle R onto the wafer W via the liquid L and the projection optical system PL; and exposes the wafer W. The liquid L in the liquid immersion region AR2 can be refreshed by: supplying the liquid L from the liquid-supplying-mechanism 10 to the liquid immersion region AR2; and collecting the liquid L disposed in the liquid immersion region AR2 by the liquid-collecting-mechanism 40; thus, contamination of the liquid L can be strictly prevented, and the temperature of the liquid L can be strictly controlled.

In the present embodiment, pure water is used as the liquid L. Various rays, e.g.: ultraviolet emission lines (e.g., g-line, h-line, and i-line) emitted from a mercury lamp; deep ultra violet rays (DUV rays), e.g., KrF excimer laser beam at a wavelength of 248 nm; and vacuum ultra violet rays (VUV rays), e.g., ArF excimer laser beam at wavelength of 193 nm, can be transmitted through pure water.

The illuminating optical system IL, illuminating the reticle R supported by the reticle stage RST by the exposure light beam EL, has: a light source for exposure; an optical integrator for uniforming the intensity of illumination of the light flux emitted from a light source; a condenser lens for condensing the exposure light beam EL emitted from the optical integrator; a relay lens system; a variable perspective aperture for setting an illumination region illuminated by the exposure light beam EL on the reticle R in a slit manner; etc. (each member is not shown in the drawings). The illumination optical system IL illuminates a predetermined portion of the illumination region on the reticle R with light beam EL which has uniform illumination.

With respect to the exposure light beam EL emitted from the illumination optical system IL, various rays can be used, e.g.: deep ultra violet rays (DUV rays), e.g., ultra violet emission lines (e.g., g-line, h-line, and i-line) emitted from a mercury lamp and KrF excimer laser beam at a wavelength of 248 nm; and vacuum ultra violet rays (VUV rays), e.g., ArF excimer laser beam at a wavelength of 193 nm and $F_2$ laser beam at a wavelength of 157 nm. ArF excimer laser is used in the present embodiment.

The reticle stage RST, supporting the reticle R, is: movable two-dimensionally in an X-Y plane orthogonal with respect to the optical axis AX of the projection optical system PL; and rotatable around a $\theta Z$ axis by fine pitches. The reticle stage RST is driven by a reticle stage driving section 51, e.g., a linear motor, controlled by the control device CONT.

A movable mirror 52 is disposed on the reticle stage RST. Also, a laser interferometer 53 is disposed corresponding to the movable mirror 52. With respect to the reticle R disposed on the reticle stage RST, the laser interferometer 53 measures: two-dimensional positions; and rotation angles, on real-time bases, and the measurement results are outputted to the control device CONT.

The control device CONT sets positions of the reticle R supported on the reticle stage RST by driving the reticle stage driving section 51 in accordance with the measurement results outputted from the laser interferometer 53.

The projection optical system PL projects/exposes the pattern PA of the reticle R onto the wafer W at a predetermined projection magnification $\beta$. The projection optical system PL is constituted by a plurality of optical elements including an optical element 2. These optical elements are disposed at an end portion, near the wafer W, of the projection optical system PL. These optical elements are supported by a barrel PK. In the present embodiment, the projection optical system PL has a reduction system having the projection magnification $\beta$, e.g., ¼ or ⅕. The projection optical system PL may be any one of the 1× magnification system and the magnifying system. The optical element 2, disposed at the end of the projection optical system PL, is disposed detachably (exchangeably) with respect to the barrel PK. The liquid L disposed in the liquid immersion region AR2 makes contact with the optical element 2.

The optical element 2 is made of fluorite. Fluorite has a high affinity for water. Therefore, the liquid L can make tight contact with substantially the entire surface of a liquid contact surface 2a of the optical element 2. That is, the liquid (water) L having high affinity for the liquid contact surface 2a of the optical element 2 is supplied. Therefore, the highly tight contact is effected between the liquid L and the liquid contact surface 2a of the optical element 2; thus, the optical path between the optical element 2 and the wafer W can be reliably filled with the liquid L. The optical element 2 may be made of silica having a high affinity for water. Water-affinity (liquid affinity) may be imparted to the liquid contact surface 2a of the optical element 2A so as to further enhance the affinity for the liquid L.

The wafer stage WST, supporting the wafer W, is provided with: a Z stage 62 for supporting the wafer W via a wafer holder; a XY stage 63 for supporting the Z stage 62; and a base 64 for supporting the XY stage 63. The wafer stage WST is driven by a wafer stage driving section 61, e.g., a linear motor, controlled by the control device CONT. The wafer stage driving section 61 drives the Z stage 62 so that positions, i.e., focusing positions of the wafer W supported by the Z stage 62 with respect to: the Z axis direction; $\theta X$ direction; and $\theta Y$ direction are fixed.

The wafer stage driving section 61, driving the XY stage 63, sets positions of the wafer W with respect to the XY direction (i.e., a direction substantially parallel with respect to an image surface of the projection optical system PL). The Z stage and the XY stage may be formed unitarily so as to provide XYZ stage which has six-degrees of freedom.

A movable mirror 65 is disposed on the wafer stage WST (Z stage 62). A laser interferometer 66 is disposed corresponding to the movable mirror 65. With respect to the wafer W disposed on the wafer stage WST, the laser interferometer 66 measures: two-dimensional positions; and rotation angles, on real-time bases, and the measurement results are outputted to the control device CONT.

The control device CONT sets positions of the wafer W supported on the wafer stage WST by driving the wafer stage driving section 61 in accordance with the measurement results outputted from the laser interferometer 66. Based on the measurement results outputted from the laser interferometer 66, the control device CONT controls so that: the Z stage 62 to control focusing positions and inclination angles with respect to the wafer W, and to coincide a surface of the wafer W with the image surface of the projection optical system PL using an auto-focus method and auto-leveling method; and the XY stage 63 to set positions of the wafer W with respect to the X axis direction and the Y axis direction.

An auxiliary plate 67, surrounding the wafer W, is disposed on the wafer stage WST (Z stage 62). The auxiliary plate 67 has a flat surface that has approximately the same height as that of the surface of the wafer W supported by the wafer holder. In this arrangement, a gap of about 1 to 2 mm is provided between an edge of the wafer W and the auxiliary plate 67. However, the liquid L scarcely flows into the gap owing to surface tension of the liquid L. Even when the vicinity of circumferential edge of the wafer W is subjected to the exposure, the liquid L can be retained under the liquid contact surface 2a of the optical element 2 by the aid of the auxiliary plate 67.

Figure 2:
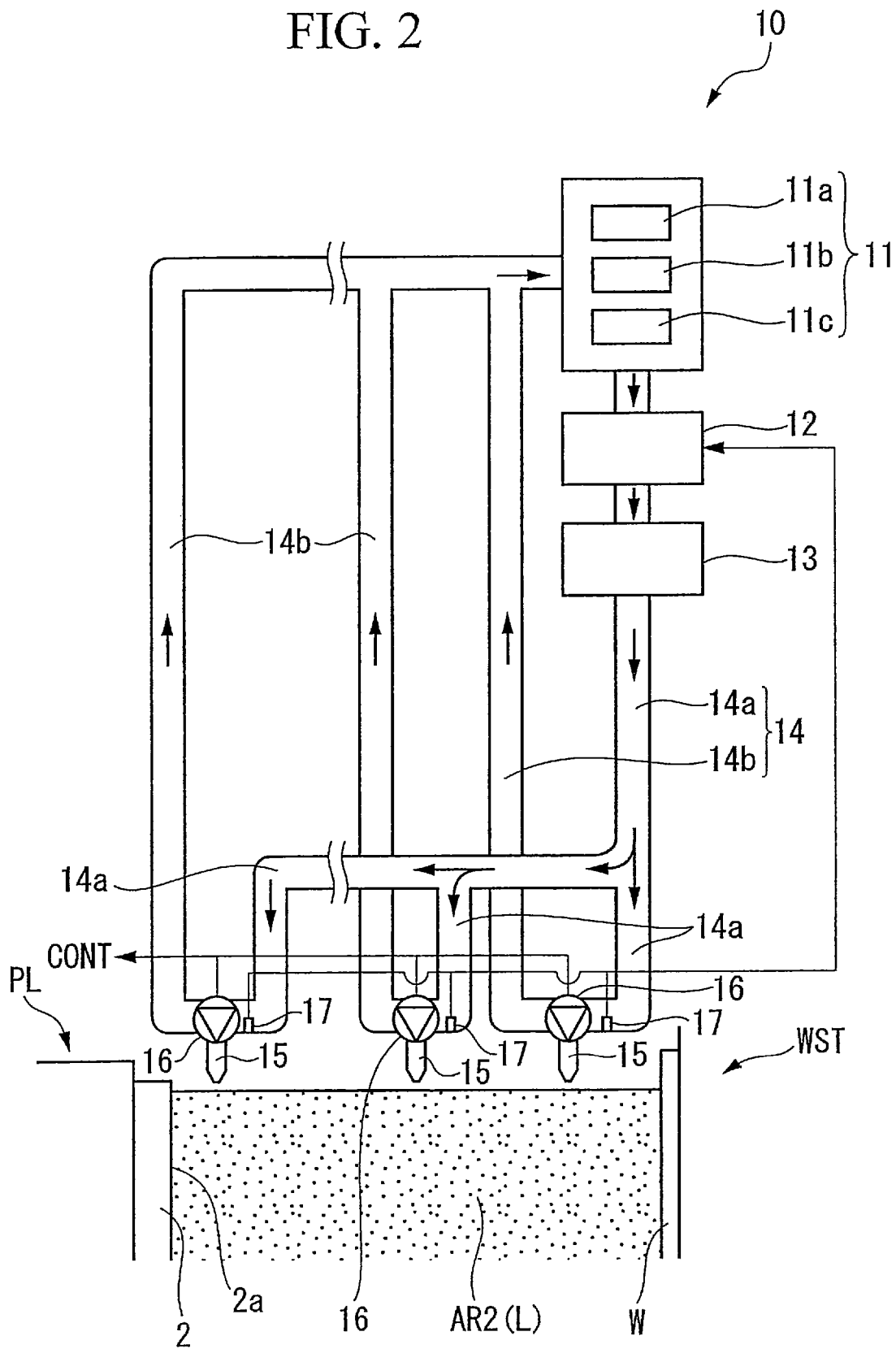
FIG. 2 is a schematic diagram of a liquid-supplying-mechanism in detail.

FIG. 2 is a schematic diagram of a liquid-supplying-mechanism 10 in detail.

As shown in FIG. 2, the liquid-supplying-mechanism 10 for supplying predetermined liquid L onto the wafer W, includes: an ultra pure water device 11 for producing the liquid L; a thermostat reservoir 12 for controlling temperature of the liquid L; a pump 13 for flowing the liquid L; a pipe section 14 having sending-side-pipes 14a and returning-side-pipes 14b; a plurality of liquid-supplying-nozzles 15 disposed in the vicinity of the surface of the wafer W; and three-way valves 16 for controlling the quantity of liquid L supplied from the supply nozzles 15.

The ultra pure water device (refining device) 11, provided with: an ion-exchanging device 11a; a bactericidal-ultraviolet-ray (UV) lamp 11b; and a filtering device 11c, produces the liquid (water) L. The thermostat reservoir 12 controls temperature of the liquid L introduced from the ultra pure water device 11 to be ±0.01° C. with respect to a predetermined temperature. The pump 13 supplies the liquid L, having the temperature controlled by the thermostat reservoir 12, to the pipe section 14 (sending-side-pipes 14a) so that the liquid L flows in the liquid-supplying-mechanism 10 entirely.

With respect to each sending-side-pipe 14a having two ends, one end thereof is connected to the pump 13, and the other end thereof is connected to the three-way valve 16; thus, the liquid L supplied from the pump 13 is introduced to the three-way valve 16. The returning-side-pipe 14b and the liquid-supplying-nozzle 15 are connected to each three-way valve 16 so that the liquid L introduced by the sending-side-pipe 14a is distributed into the returning-side-pipe 14b and the liquid-supplying-nozzle 15. The returning-side-pipe 14b is connected to the ultra pure water device 11 so that the liquid L which has not been supplied to the liquid-supplying-nozzle 15 is introduced to the ultra pure water device 11. Circulation flow paths in the liquid-supplying-mechanism 10 are formed by the above explained members: the ultra pure water device 11; the thermostat reservoir 12; the pump 13; the sending-side-pipes 14a; the three-way valves 16; and the returning-side-pipes 14b.

The liquid L supplied from the three-way valves 16 to the liquid-supplying-nozzles 15 is further supplied onto the wafer W by the liquid-supplying-nozzles 15. An open state of valve sections built in each three-way valve 16 is varied in accordance with command outputted from the control device CONT so that quantity of the liquid L supplied to the liquid-supplying-nozzles 15 is adjusted. By doing this, it is possible to: change the quantity of the liquid L supplied onto the wafer W in accordance with exposure sequences; or stop supplying the liquid L when the wafer W is exchanged.

With respect to each sending-side-pipe 14a, a temperature sensor 17, measuring the temperature of the liquid L which is about to be supplied onto the wafer W, is disposed therein near the three-way valve 16. Measurement results measured by the temperature sensor 17 are sent to the thermostat reservoir 12. The thermostat reservoir 12 controls the temperature of the liquid L in the thermostat reservoir 12 so that the temperature of the liquid L which is about to be supplied onto the wafer W is a predetermined temperature. With respect to each three-way valve 16, all the liquid L flowing in the sending-side-pipe 14a is made to flow in the returning-side-pipe 14b by the three-way valve 16; thus, the temperature of the flowing liquid L is measured by the temperature sensor 17 and adjusted by the thermostat reservoir 12. Therefore, it is possible to supply the liquid L having a predetermined and adjusted temperature onto the wafer W immediately after stopping the supply of the liquid L to the liquid-supplying-nozzle 15 and restarting the supply to the liquid-supplying-nozzle 15. In addition, with respect to the pipe sections 14, at least each sending-side-pipe 14a is surrounded by a thermally-insulating-member. By doing this, it is possible to adjust the temperature of the liquid L supplied onto the wafer W highly accurately.

Figure 3A:
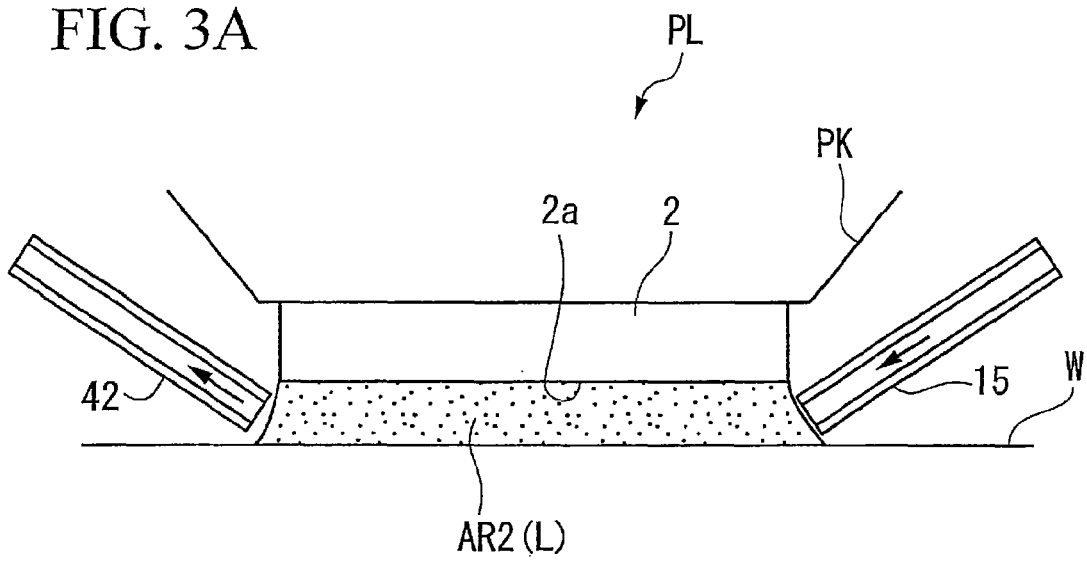
FIG. 3A shows an arrangement of liquid-supplying-nozzles in the liquid-supplying-mechanism and liquid-collecting-nozzles in a liquid-collecting-mechanism.
Figure 3B:
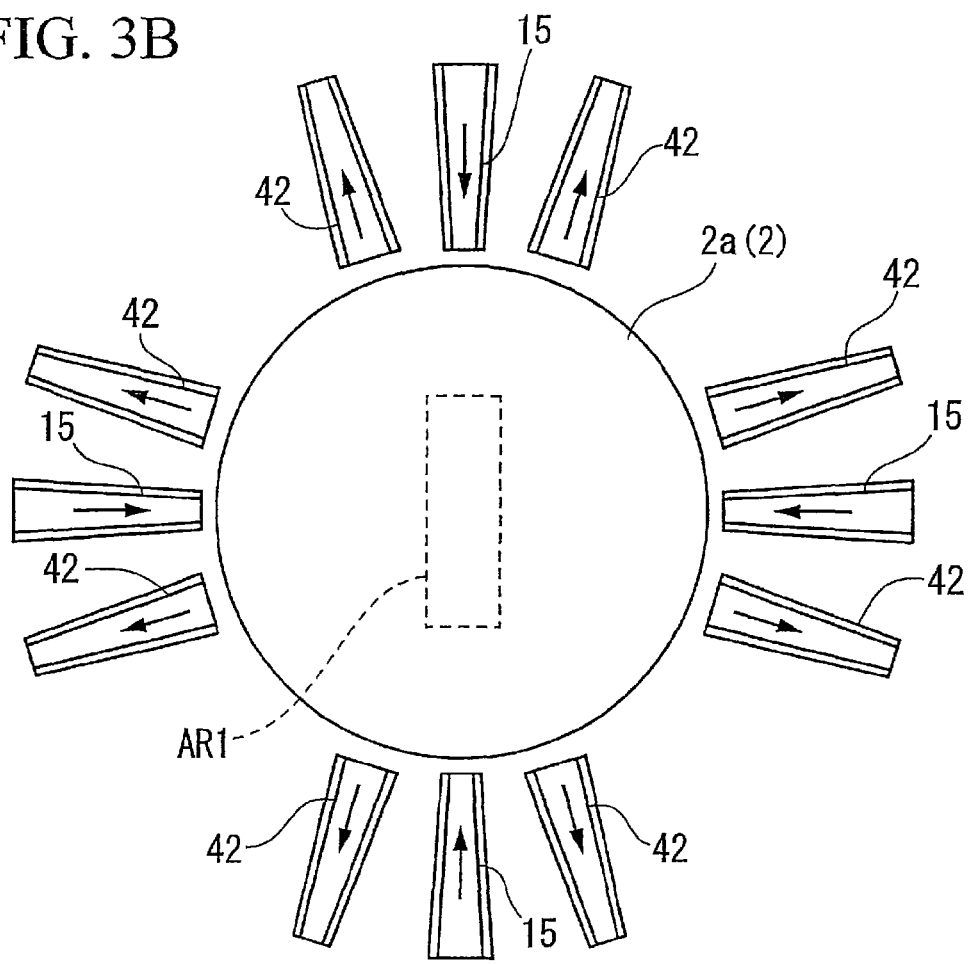
FIG. 3B shows an arrangement of liquid-supplying-nozzles in the liquid-supplying-mechanism and liquid-collecting-nozzles in a liquid-collecting-mechanism.

FIGS. 3A and 3B show dispositions of: the liquid-supplying-nozzles 15 disposed in the liquid-supplying-mechanism 10; and liquid-collecting-nozzles 42 disposed in the liquid-collecting-mechanism 40. More specifically, FIG. 3A is a side view, and FIG. 3B shows a bottom end section of the projection optical system PL viewed from the wafer W.

With respect to directions defined on the surface of the wafer W, each liquid-supplying-nozzles 15 disposed in the vicinity of the surface of the wafer W is disposed differently with respect to each other. More specifically, as shown in FIG. 3B, four liquid-supplying-nozzles 15 are disposed around the liquid immersion region AR2 so that: one pair of the liquid-supplying-nozzles 15 are disposed on both sides (+X direction, −X direction) with respect to the scanning direction respectively; and another pair of the liquid-supplying-nozzles 15 are disposed on both sides (+Y direction, −Y direction) with respect to a non-scanning direction respectively.

Note that, members for flowing the liquid L therein and forming the liquid-supplying-mechanism 10 may be formed of a synthetic resin, e.g., polytetrafluorethylene. By doing this, impurities can be restricted in the liquid L.

Thus, operation for supplying the liquid L by the liquid-supplying-mechanism 10 is controlled by the control device CONT, i.e., the control device CONT independently controls: the ultra pure water device 11; the thermostat reservoir 12; the pump 13; and the three-way valves 16. By doing this, it is possible to control: the quantity of liquid L produced by the liquid-supplying-mechanism 10; the temperature of the liquid L; and the quantity of liquid L supplied onto the wafer W per unit length of time, etc. (see FIG. 1).

With reference to FIG. 1 again, the liquid-collecting-mechanism 40 collecting the liquid L disposed on the wafer W includes: a suction device 41 which can collect the liquid L; a plurality of the liquid-collecting-nozzles 42 disposed in the vicinity of the surface of the wafer W; and a connecting section 43 which connects the suction device 41 and the liquid-collecting-nozzles 42. The liquid-collecting-mechanism 40 further includes a tank, etc., for containing the collected liquid L, having been disposed on the wafer W, via the liquid-collecting-nozzles 42.

Similarly to the liquid-supplying-nozzles 15, with respect to directions defined on the surface of the wafer W, each liquid-collecting-nozzle 42 disposed in the vicinity of the surface of the wafer W is disposed differently with respect to each other. More specifically, as shown in FIG. 3B, the liquid-supplying-nozzles 15 are disposed around the liquid immersion region AR2 so that: one pair of the liquid-supplying-nozzles 15 is disposed on both sides (+X direction, −X direction) with respect to the scanning direction respectively; another pair of the liquid-supplying-nozzles 15 is disposed on both sides (+Y direction, −Y direction) with respect to a non-scanning direction respectively; and each liquid-supplying-nozzle 15 is provided between by a pair of liquid-collecting-nozzles 42. This is intended: to prevent defects in the exposure device EX; and to prevent the liquid from leaking out of the liquid immersion region AR2, by disposing as many more sets of the liquid-collecting-nozzles 42 as possible than the liquid-supplying-nozzles 15.

Similarly to the liquid-supplying-mechanism 10, in order to restrict impurities included in the liquid L, members for flowing the liquid L therein and forming the liquid-collecting-mechanism 40 may be formed of a synthetic resin, e.g., polytetrafluoroethylene.

Operation for collecting the liquid by the liquid-collecting-mechanism 40 is controlled by the control device CONT, i.e., it is possible to control the quantity of liquid L to-be-collected by the liquid-collecting-mechanism 40 per unit length of time.

Next, a method is explained for exposing images of the pattern PA of the reticle R onto the wafer W using the above explained exposure device EX.

To begin with, the reticle R is loaded onto the reticle stage RST, and the wafer W is loaded onto the wafer stage WST. In order to perform a scanning exposure process, the control device CONT: drives the liquid-supplying-mechanism 10; and starts supplying the liquid onto the wafer W.

With respect to operations for supplying the liquid, members included in the liquid-supplying-mechanism 10: the ultra pure water device 11; the thermostat reservoir 12; the pump 13; and the three-way valves 16, are operated; thus, the liquid L flows (circulates) in the circulation flow paths (pipe section 14). That is: the liquid L is produced by the ultra pure water device 11; the temperature of the liquid L is adjusted by the thermostat reservoir 12 based on measurement results outputted from the temperature sensor 17; and the pump 13 flows the liquid L at a predetermined flow rate. All the liquid L flows from the sending-side-pipes 14$a$ to the returning-side-pipes 14$b$ via the three-way valves 16. By doing this, the liquid L having highly accurately controlled temperature flows (circulates) in the circulation flow paths (pipe sections 14). Similarly to the previous refining operation, the liquid L flowing into the ultra pure water device 11 is refined through: the ion exchanging device 11$a$; the bactericidal-ultra-violet-ray (UV) lamp 11$b$; and the filtering device 11$c$; thus, impurities and bacterium included in the liquid L are eliminated. Similarly to the previous temperature control, the temperature of the liquid L is adjusted by the thermostat reservoir 12 again, and the temperature-adjusted liquid L is supplied to the sending-side-pipes 14$a$ by the pump 13 again.

Next, the three-way valves 16 are operated so as to supply the liquid L from the liquid-supplying-nozzles 15 onto the wafer W.

By doing this, the liquid immersion region AR2 is formed under the liquid contact surface 2$a$ of the optical element 2 disposed at a bottom end of the projection optical system PL. Note that not only all the liquid L flowing in the circulation flow paths (pipe sections 14) may be supplied to the liquid immersion area AR2 but also a portion of the liquid L flowing in the circulation flow paths (pipe sections 14) may be supplied to the liquid immersion area AR2. Fresh liquid L is produced by the ultra pure water device 11 so as to compensate for the portion supplied onto the wafer W and introduce the liquid L continuously into the sending-side-pipes 14$a$ of the pipe section 14.

In addition, supplying the liquid L onto the wafer W from the liquid-supplying-nozzles 15 is maintained after forming the liquid immersion region AR2. Also, the liquid-collecting-mechanism 40 is operated simultaneously so as to: collect the liquid L in order to avoid flood of the liquid over the liquid immersion region AR2; and maintain such a state.

By doing this; the liquid immersion region AR2 is filled with the liquid L before starting the exposure; the temperature of the liquid is adjusted continuously; and the impurity-free-liquid is supplied and collected.

Next, predetermined preparations are conducted, e.g.: aligning the reticle R by using a reticle microscope and an off-axis alignment sensor, etc. (not shown in the drawings); and measuring base lines of alignment sensors, under the control by the control device CONT after setting various exposure conditions. After that, fine alignment (enhanced global alignment (EGA), etc.) of the wafer W using the alignment sensors is completed; thus, disposition coordinates with respect to a plurality of shot regions on the wafer W are determined.

After completing the preparation for exposing the wafer W, the control device CONT, while monitoring values measured by the laser interferometer 66, drives the wafer stage driving section 61 to an acceleration starting position (scanning start position) for a first exposure shot (first shot region) to the wafer W and moves the wafer stage WST in accordance with results obtained in the alignment sensing operation.

Next, the control device CONT: drives the reticle stage driving section 51 and the wafer stage driving section 61; and starts scanning the reticle stage RST and the wafer stage WST with respect to the X axis direction. After the reticle stage RST and the wafer stage WST reach a predetermined scanning speed respectively, the pattern regions of the reticle R are illuminated by the exposure light beam EL emitted from the illuminating optical system IL, and the scanning exposure begins.

Different sections in the pattern region of the reticle R are illuminated by the exposure light beam EL sequentially. By completing the illumination on all the pattern regions, the scanning exposure for the first shot region on the wafer W is completed. By doing this, a reduced-size pattern PA of the reticle R is transferred onto a photo-resist layer in the first shot region on the wafer W via the projection optical system PL and the liquid L.

After the scanning exposure to the first shot region is completed, the control device CONT moves the wafer stage WST with respect to the X axis direction and the Y axis direction stepwise to be at the acceleration starting position for exposing a second shot region. That is, an inter-shot stepping movement is conducted. The above explained scanning exposure is conducted on the second shot region.

By doing this, the scanning exposure to the shot regions on the wafer W and the stepping movements for exposing the following shot regions are repeated; thus, the pattern PA of the reticle R is transferred onto all the shot regions-to-be-exposed on the wafer W sequentially.

Also, when the wafer W is exposed, the control device CONT adjusts the open state of the three-way valves 16 in accordance with a target scanning speed so that a necessary quantity of the liquid L in accordance with the target scanning speed is supplied onto the wafer W. An appropriate one of the three-way valves 16 is selected in accordance with the scanning direction and the stepping direction of the wafer W; thus, opening/closing movement is conducted by the selected three-way valve 16.

After exposing the wafer W, the three-way valves 16 disposed in the liquid-supplying-mechanism 10 are operated so as to stop supplying the liquid L onto the wafer W. In addition, operation of the ultra pure water device 11, the thermostat reservoir 12, and the pump 13 is maintained. Therefore, the liquid L in the liquid-supplying-mechanism 10 keeps flowing (circulating) in the above explained circulation flow paths (pipe sections 14).

Also, the liquid-collecting-mechanism 40 is operated so as to collect all the liquid L disposed on the liquid immersion region AR2.

After completing collecting the liquid L, the wafer W is exchanged so as to form the liquid immersion region AR2 on a new wafer W; and the exposure is started.

By repeating such operations, a plurality of wafers W are exposed.

As above explained, when the wafer W is exchanged, the liquid-supplying-mechanism 10 stops supplying the liquid L onto the wafer W. Therefore, as far as the liquid-supplying-mechanism in a conventional exposure apparatus is concerned, liquid L stops in pipes disposed between the thermostat reservoir and liquid-supplying-nozzles. Such unmoving liquid L may be affected by external factors, i.e.: temperature of the liquid L may vary; impurities are included in the liquid L; and bacterium grow in the liquid L. In particular, if the liquid-supplying-mechanism 10 stops supplying the liquid onto the wafer W for a long time for purposes, e.g., repair, and inspection, the temperature of the unmoving liquid L inevitably varies.

Therefore, in the conventional exposure apparatus, it is necessary to discharge the stopped liquid L in the pipes disposed between the thermostat reservoir and the liquid-supplying-nozzles if the liquid-supplying-mechanism 10 stops supplying the liquid L onto the wafer W and restarts supplying the liquid L again so as to form the liquid immersion region AR2 on a new wafer W. If the liquid L is highly contaminated, time necessary for such disposal will be too long; thus, non-working time of the exposure apparatus will be prolonged.

However, as far as the exposure apparatus of the present invention is concerned, the liquid L in the liquid-supplying-mechanism 10 flows, i.e., circulates continuously even when the liquid-supplying-mechanism 10 stops supplying the liquid L onto the wafer W. In addition, the ultra pure water device 11 and the thermostat reservoir 12 are disposed on the circulation flow paths. Therefore, the liquid L is refined through members of the ultra pure water device 11, i.e.: ion exchanging device 11a; the bactericidal-ultra-violet-ray (UV) lamp 11b; and a filtering device 11c. Impurities and bacterium included in the liquid L are eliminated accordingly. In addition, the liquid L passes through the thermostat reservoir 12 several times; thus, the temperature of the liquid L can be adjusted uniformly.

By doing this, according to the exposure apparatus EX of the present embodiment, the temperature of the liquid L is prevented from varying and contamination is prevented even if the liquid-supplying-mechanism 10 stops supplying the liquid L onto the wafer W. Therefore, it is possible to form the liquid immersion region AR2 and restart the exposure immediately after exchanging the wafer without discharging the contaminated liquid L.

As explained above, it is possible to continuously fill the temperature-controlled liquid L under the liquid contact surface 2a of the optical element 2 disposed in a bottom end of the projection optical system PL in the present embodiment of the exposure apparatus EX. In addition, the liquid L is ultra pure water; thus, there is an advantage that a photo-resist and the optical elements disposed on the wafer W are not affected. Also, ultra pure water does not affect ambient conditions and contains an extremely low amount of impurities; therefore, function, i.e., effect can by expected for cleaning the liquid contact surface 2a of the optical element 2 by the ultra pure water. Refractive index n of ultra pure water (water) with respect to the exposure light beam EL having a wavelength of 193 nm is approximately 1.47; therefore, if a light source for emitting the exposure light beam EL emits an ArF excimer laser beam (having wavelength 193 nm), high resolution having approximately 131 nm of shortened, i.e., 1/n, wavelength can be obtained on the wafer W. The depth of focus is magnified by approximately by 1.47 times, i.e., magnified n times than a case in which air exists instead of the liquid immersion region AR2. Therefore, a greater numerical aperture of the projection optical system PL can be realized than in the case in which air exists instead of the liquid immersion region AR2 as long as the depth of focus remains equivalent whether air or liquid is used. This insight improves the obtained resolution.

Figure 4:
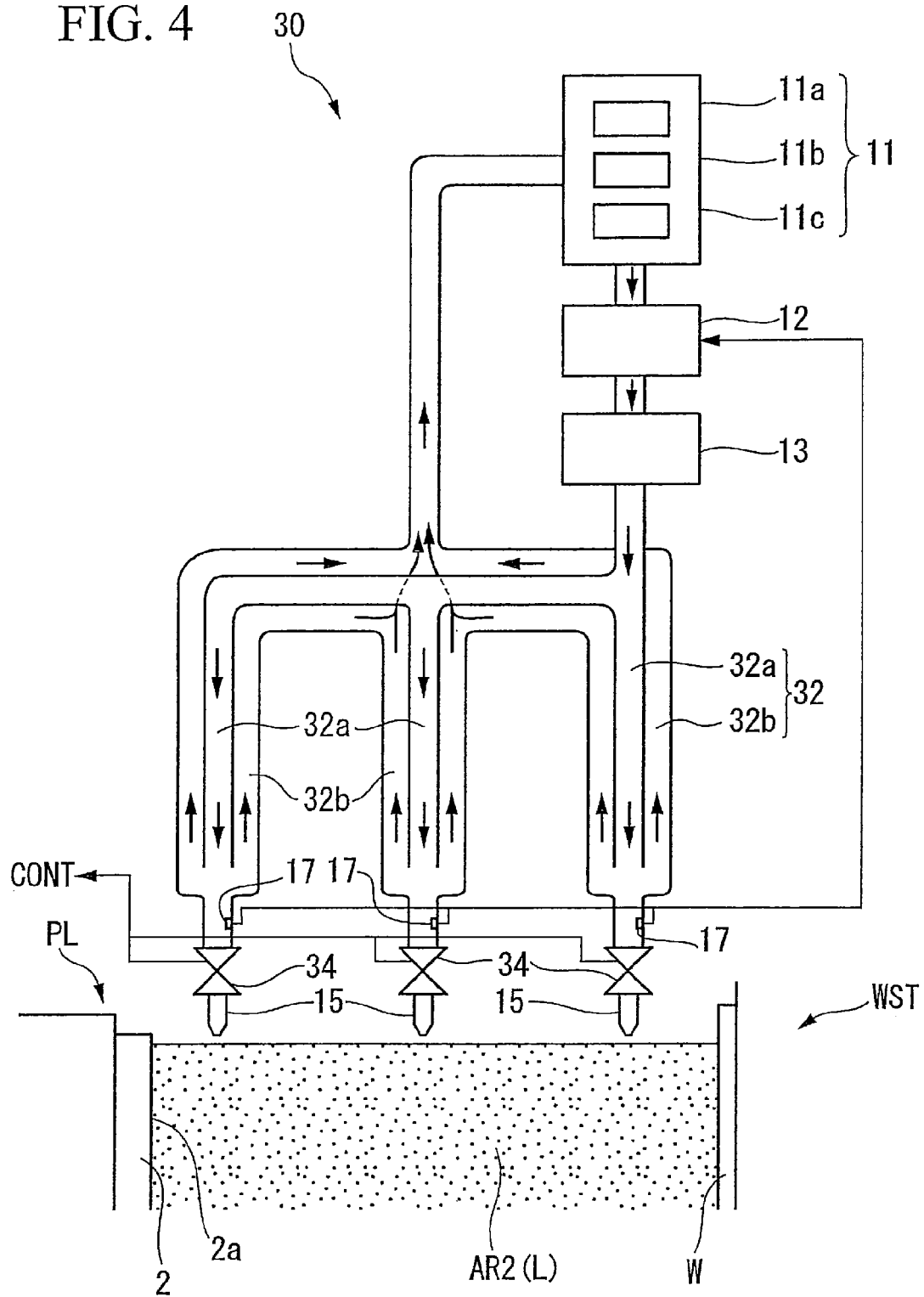
FIG. 4 is a schematic view showing the liquid-supplying-mechanism in which a part of pipe sections are formed by double pipes.

FIG. 4 is a schematic view showing the liquid-supplying-mechanism 30 in which a part of pipe sections are formed by double pipes. Same reference numerals are added to the same members as the liquid-supplying-mechanism 10 so as to omit explanations thereof.

As shown in FIG. 4, a part of a pipe section 32 in a liquid-supplying-mechanism 30 is a double pipe formed by inner pipes 32a and outer pipes 32b.

Thus, circulation flow paths of the liquid L produced by the ultra pure water device 11 are formed by: flow paths (sending-side-paths) formed by introducing the liquid L into the inner pipes 32a of the pipe section 32 via the thermostat reservoir 12 and the pump 13, and by leading to tip sections of the pipe section 32; and flow paths (returning-side-paths) formed from tip sections of the pipe section 32 to the ultra pure water device 11 through the outer pipes 32b forming the pipe section 32.

Also, the liquid-supplying-nozzle 15 is disposed on a tip of each pipe section 32 via a control valve (two-way valve) 34 so that at least a portion of the liquid L flowing in the circulation flow paths (pipe sections 32) is discharged (supplied) onto the wafer W from the liquid-supplying-nozzles 15 by releasing the control valve 34.

In the liquid-supplying-mechanism 30 according to the present embodiment, a part of each piping section is a double pipe having the inner pipe 32a and the outer pipe 32b. In addition, the liquid L flows in the circulation flow paths, which is composed of the inner pipe 32a acts as a sending-side-path and the outer pipe 32b acts as a returning-side-path. Therefore, the liquid L flowing in the outer pipe 32b serves as a thermally-insulating-material; thus, it is possible to restrict the temperature of the liquid L from varying. In particular, because of the flowing liquid L serving as the thermally-insulating-material, the thermal-insulating effect is high. In addition, it is possible to obtain a more desirable thermal-insulating effect by using the liquid L, i.e. water having a greater specific heat. It is desirable e.g., to wind the thermally-insulating-material around a non-double-pipe portion of the pipe sections 32.

By doing this, it is possible to: supply the refined and temperature-controlled liquid L onto the wafer W stably; restrict the wavelength of the exposure light beam EL emitted onto the liquid immersion region AR2 from varying; and expose micro-patterns PA onto the wafer W.

Figure 5:
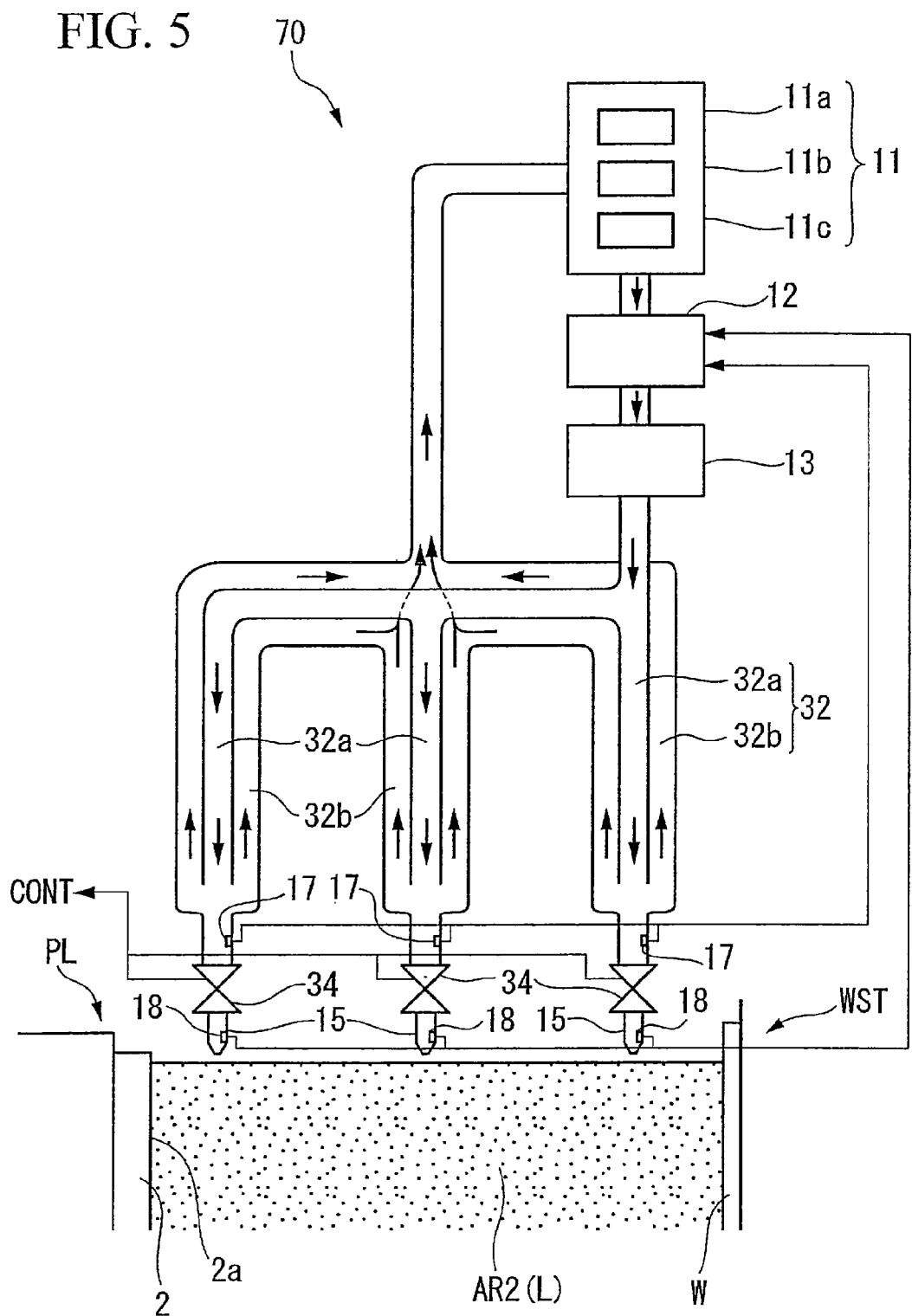
FIG. 5 is a schematic view showing a different embodiment of the liquid-supplying-mechanism.

FIG. 5 is a schematic view showing an embodiment of a liquid-supplying-mechanism 70 different from the liquid-supplying-mechanism 30. Same reference numerals are added to the same members of the liquid-supplying-mechanism 30 so as to omit explanations thereof.

The liquid-supplying-mechanism 70 is different from the liquid-supplying-mechanism 30 in that a second temperature sensor 18 is disposed on each liquid-supplying-nozzle 15 in the liquid-supplying-mechanism 70. Each second temperature sensor 18 measures the temperature of the liquid L which has passed the control valve 34 and is about to be supplied onto the wafer W. Measurement results measured by each second temperature sensor 18 are sent to the thermostat reservoir 12. The thermostat reservoir 12 controls the temperature of the liquid L contained in the thermostat reservoir 12 in accordance with a measurement result corresponding to at least one of the temperature sensor 17 and the temperature sensor 18.

Controlling the temperature of the liquid L in the present embodiment is explained in detail. To begin with, each control valve 34 is released. If at least a portion of the liquid L flowing in the inner pipes 32a is supplied onto the wafer W, the thermostat reservoir 12 controls the temperature of the liquid L so that the measurement results measured by the second temperature sensor 18 coincide with a predetermined target temperature. Simultaneously, the measurement result measured by each first temperature sensor 17 is memorized. Alternatively, the difference between the measurement result measured by the second temperature sensor 18 and the measurement result measured by the first temperature sensor 17 may be memorized.

Next, each control valve 34 is closed so as to stop supplying the liquid L onto the wafer W. If all of the liquid L flowing in the inner pipes 32a flows into the outer pipes 32b, the liquid L does not pass through each liquid-supplying-nozzle 15. The measurement results measured by the second temperature sensors 18 are not suitable for controlling the temperature of the liquid L because each second temperature sensor 18 cannot measure the temperature of the flowing liquid L. Therefore, with respect to the thermostat reservoir 12, temperature sensors used for controlling the temperature of the liquid L are switched to the first temperature sensors 17 so that the temperature of the liquid L is controlled to be the predetermined target temperature using only the first temperature sensors 17. In this case, the thermostat reservoir 12 uses the temperature which is measured by the first temperature sensors 17 in a state where the control valves 34 are released; and the temperature of the liquid L is controlled using the second temperature sensors 18 as the target temperature. Alternatively, the previously-memorized value, i.e., difference between the measurement result obtained by the second temperature sensor 18 and the measurement result obtained by the (first) temperature sensor 17, may be offset to the final target temperature of the liquid L so as to determine the current target temperature of the liquid L.

The liquid-supplying-mechanism 70 of the present embodiment is provided with the second temperature sensors 18; therefore, it is possible to measure the temperature of the liquid L which has passed the control valves 34, and it is possible to control the temperature of the liquid L supplied onto the wafer W more reliably. Also, the liquid-supplying-mechanism 70 has several pairs of temperature sensors, i.e., several pairs of the first temperature sensor 17 and the second temperature sensor 18, so that each control valve 34 is provided between each pair of the sensors. Therefore, it is possible to maintain optimum temperature of the liquid L even if the control valves 34 are closed. As a result of this, it is possible to control the temperature of the liquid L to be the target temperature whenever the control valves 34 are released afterwards.

The sequence of operations explained in the above embodiment, shapes of members used in the embodiment, and combination thereof are mere examples. Various modifications are possible within the scope and spirit of the present invention in accordance with other factors, e.g., processing conditions and design requirements, etc. The present invention includes the following modifications.

The present invention is not limited to the above explained embodiment showing an example in which the liquid L, flowing in the returning-side-pipes (outer pipes) 14b and 32b of the pipe sections 14 and 32, returns to the ultra pure water device 11. That is, the liquid L which has not been supplied onto the wafer W may be discharged: to the liquid-collecting-mechanism 40; or out of the exposure apparatus EX.

Also, with respect to the liquid-supplying-mechanisms 10 and 30, the liquid L which has not been supplied onto the wafer W may be returned to the thermostat reservoir 12 instead of the ultra pure water device 11.

In order to return the liquid L to the thermostat reservoir 12, it is desirable to dispose filters and disinfecting devices between: the returning-side-pipes (outer pipes) 14b and 32b in the pipe sections 14 and 32; and; the thermostat reservoir 12.

The liquid L which has not been supplied onto the wafer W may be returned to the ultra pure water device 11 and the thermostat reservoir 12 while discharging a predetermined quantity of the liquid L: to the liquid-collecting-mechanism 40; or out of the exposure apparatus EX.

The present invention is not limited to the above explained embodiment showing an example in which the exposure apparatus EX has the ultra pure water device 11. That is, ultra pure water (liquid L) may be supplied to the exposure apparatus EX from the semiconductor factory. In such a case, the liquid L flowing in the returning-side-pipes 14b (outer pipes 32b) may be returned to the ultra pure water device 11. In addition, the flow of the liquid L in the returning-side-pipes 14b (outer pipes 32b) may be joined to the liquid-collecting-mechanism 40. Also, the liquid L may be exhausted out of the exposure apparatus EX.

The present invention is not limited to the above explained embodiment in which the temperature of the liquid L is adjusted only using the thermostat reservoir 12. That is, additional temperature-controlling-devices may be disposed in the vicinity of the liquid-supplying-nozzles 15. In such a case, the temperature-controlling-devices may be formed by combining: heaters; peltier elements; the liquid-supplying-nozzles 15; and temperature sensors.

Also, as shown in FIGS. 3A and 3B, the liquid-supplying-nozzles 15 and the liquid-collecting-nozzles 42 may have various shapes, e.g., taper, fan, and slit. Also, with respect to dispositions and quantities, various modifications are possible to the liquid-supplying-nozzles 15 and the liquid-collecting-nozzles 42 desirably.

In the above explained embodiment, the optical element 2, attached to a tip of the projection optical system PL, is a lens. It is possible to adjust optical characteristics, i.e., aberrations, e.g., spherical aberration and comatic aberration by the lens. With respect to a cheaper material than the lens, a plate having parallel plain surfaces can be used for the optical element 2.

Compared to the optical element, i.e., lens contacting the liquid L, it is advantageous to use a plate having parallel and plane surfaces from a cost point of view because replacing a plate having parallel plain surfaces with another new plate having parallel plain surfaces can be conducted adjacent to supplying the liquid L even if substances (e.g., silicon-containing organic substance) deteriorating optical characteristics, i.e., transmissivity with respect to the projection optical system PL, illumination intensity on the wafer W illuminated by the exposure light beam EL, and illumination distribution uniformity thereon attach to the plate during: transporting; assembling; and adjusting the exposure apparatus EX. That is, the surfaces of the optical element contacting the liquid L may be stained if particles, splashing from photo-resist illuminated by the exposure light beam EL or impurities included in the liquid L, attach thereto. Therefore, the optical element must be replaced periodically. Replacing such an optical element with a plate having parallel and plain surfaces can realize: a lower cost of replacement parts than the lens; and shorter time for exchanging a plate with another. Thus, it is possible to restrict: increase in maintenance cost (running cost); and decrease in throughput.

Also, with respect to a pressure value indicating a pressure difference caused by the flow of the liquid L, if there is a great difference between the optical element 2 disposed at the tip of the projection optical system PL and the wafer W, the optical element 2 may be fixed thereon so as not to be affected by the pressure difference instead of using an exchangeable optical element 2.

Although water is used as the Liquid L in the above explained embodiment, the liquid L may be other than water. For example, considering that one of the exposure light beams EL, i.e., $F_2$ laser, is not transmissive through water, the liquid L may be a fluorine fluid, e.g., a fluorocarbon oil or a perfluoropolyether (PFPE) fluorocarbon fluid through which the $F_2$ laser is transmissive. In such a case, it is desirable that liquid affinity is imparted to a part of the optical element contacting the liquid L by forming thin films thereon including molecular substances having small polarity, e.g., fluorine.

Also, another liquid can be used, e.g., cedar oil having: transmittance with respect to the exposure light beam EL; as high a refractive index as possible; and stability with respect to the photo-resist coated on the projection optical system PL and the surface of the wafer W. In such a case, surface treatment is conducted in accordance with the polarity of the liquid L.

Also, the wafer W is not limited to semiconductor wafers used for manufacturing semiconductor devices. That is, glass substrates used for display devices, and ceramic wafers used for thin-film magnetic heads are available for use.

The exposure apparatus EX may be: not only a scanning exposure device (scanning stepper) which uses a step-and-scan method in which a pattern of the reticle is scanned and exposed by moving the reticle and the wafer synchronously; but also a projection exposure device (stepper) which uses a step-and-repeat method in which the pattern of the reticle is exposed in a single exposure session while the reticle and the wafer being substantially kept stationarily, and the wafer is moved in a step manner. Also, the present invention can be applied to an exposure device which uses a step-and-stitch method in which at least two partially-overlapping patterns are transferred onto the wafer.

Also, the present invention can be adapted to twin-stage exposure apparatuses disclosed in, e.g.: Japanese Unexamined Patent Application, First Publication No. H 10-163099; Japanese Unexamined Patent Application, First Publication No. H 10-214783; and Published Japanese translation No. 2000-505958.

Types of the exposure apparatus EX are not limited to exposure devices used to manufacture semiconductor elements by exposing patterns of semiconductor elements onto wafers. The exposure apparatus EX may be a wide variety of exposure devices used to manufacture, e.g., liquid crystal display elements, displays, thin-film magnetic heads, image-capturing elements (CCD), reticles, or masks.

Linear motors in accordance with any one of types, e.g., an air-floating linear motor which uses air-bearings, and a magnetic-levitation-type linear motor which uses Lorentz force or reactance force, can be used for the wafer stage and the reticle stage. Also, the stages in accordance with any one of types, e.g., moving along guides, and moving without guides, can be used. In addition, flat motors can be used for a device for driving stages by: connecting one of either a magnetic unit (permanent magnet) or an armature unit to the stage; and disposing the other one of either the magnet unit or the armature unit onto a moving-side of stage (base).

The reaction force generated by the movement of the wafer stage may be released to a floor (ground) mechanically, e.g., using frame members as disclosed in Japanese Unexamined Patent Application, First Publication No. H 8-166475.

The reaction force generated by the movement of the reticle stage may be released to a floor (ground) mechanically, e.g., using frame members as disclosed in Japanese Unexamined Patent Application, First Publication No. H 8-330224.

The numerical aperture (NA) with respect to the projection optical system may be 0.9 to 1.3 in the case of the liquid immersion method as explained above. The image-focusing capability of the projection optical system having such a large numerical aperture NA may be deteriorated due to a polarization effect if conventional exposure light beam, e.g., a random-polarization light beam is used. Therefore, it is desirable to use polarization illumination. In such a case, it is desirable to illuminate beams having linear polarizations corresponding to a longitudinal direction with respect to line patterns forming a line-and-space pattern on the reticle so that more diffracted beams having S-polarization component (polarization component corresponding to a longitudinal direction with respect to the line pattern) are emitted from the reticle pattern. Compared to a case in which a space between: a photo-resist coating a surface of a wafer; and the projection optical system, is filled by air (gaseous substance), transmissivity of diffracted beams having S-polarization component, which contribute to improving contrast, is high on a surface of the photo-resist if the space between: the photo-resist coating the surface of wafer; and the projection optical system, is filled by liquid. Therefore, it is possible to realize better image-focusing capability even if the numerical aperture NA of the projection optical system exceeds 1.0. Also, it is more effective to combine a phase-shift mask and oblique incident illumination method (in particular, dipole-illumination-method) conducted corresponding to a longitudinal direction with respect to the line pattern disclosed in, e.g., Japanese Unexamined Patent Application, First Publication No. H 6-188169.

Also, it is effective not only to combine: the oblique incident illumination method; and a linear polarization illumination (S-mode polarization illumination) method in which beams correspond to a longitudinal direction of the line pattern of the reticle; but also to combine: the oblique incident illumination method; and a polarization illumination method in which beams have linear polarization (modes) with respect to a tangent line direction contacting a circle having a center corresponding to an optical axis, as disclosed in Japanese Unexamined Patent Application, First Publication No. H 6-53120. In particular, even if: the numerical aperture NA of the projection optical system is remarkably great; and the reticle pattern includes not only line patterns expanding with respect to a predetermined direction but also line patterns expanding with respect to a plurality of different directions, it is possible to realize better image-focusing capability by compatibly conducting: the polarization illumination method in which beams have linear polarization (modes) with respect to a tangent line direction contacting a circle having a center corresponding to an optical axis; and annular illumination method, as disclosed in the previously mentioned Japanese Unexamined Patent Application, First Publications No. H 6-53120.

The exposure apparatus adapting the present invention is manufactured by assembling various sub-systems, e.g., each element recited in Claims of the present application so that the exposure device maintains predetermined accuracies, i.e., mechanical accuracy, electrical accuracy, and optical accuracy. In order to achieve these accuracies, the optical accuracy is adjusted in each of the optical systems, the mechanical accuracy is adjusted in each of the mechanical systems, and the electrical accuracy is adjusted in each of electrical systems before and after the assembly. Steps in which the sub-systems are assembled to manufacture the exposure device include mutual connections, i.e., mechanical connection among the sub-systems, electrical connection of wirings and electrical circuits, and pipe connection of air pressure circuits. Each one of the sub-systems must be assembled before the assembly of the sub-systems to manufacture the exposure device. After assembling the sub-systems to manufacture the exposure device is completed, comprehensive adjustment is conducted; thus, the accuracies are obtained for the entire exposure device. It is desirable that the exposure device be manufactured in clean rooms in which temperature and cleanliness are controlled.

Also, as shown in FIG. 6, the semiconductor device is manufactured by: step 201 for designing function and capability of the device; step 202 for manufacturing a mask (reticle) based on the design of the step 201; step 203 for manufacturing wafers from a silicon material; step 204 for treating the wafers, step 204 including a photolithographic step in which patterns of the reticle are exposed onto the wafers using the exposure apparatus of the above explained embodiment; step 205 for assembling devices, e.g., dicing step, bonding step, and packaging step; and step 206 for inspection, etc.

According to the present invention, the liquid does not stop in the pipe sections when wafers are exchanged; therefore, the temperature of the liquid hardly varies and contaminants hardly invade into the liquid. Also, it is possible to prevent: the temperature of the liquid from varying; and the liquid from containing impurities, while minimizing the quantity of the liquid-to-be-consumed. Also, it is possible to supply the liquid having an approximately constant temperature onto the substrate from the liquid-supplying-section.

What is claimed is:

1. An exposure apparatus that exposes a substrate via a projection optical system and liquid, the apparatus comprising:
    a first pipe section that includes at least one first pipe and that flows liquid supplied from a liquid supplying device; and
    a second pipe section that includes at least one second pipe, at least a portion of the at least one second pipe is disposed at an outside of at least a portion of the at least one first pipe so that the portion of the first pipe is surrounded by and within the portion of the second pipe, wherein the second pipe section also flows liquid supplied from the liquid supplying device.

2. The exposure apparatus according to claim 1, wherein the first pipe section is formed of resin.

3. The exposure apparatus according to claim 1, wherein the second pipe section is formed of resin.

4. The exposure apparatus according to claim 1, wherein a flowing direction of the liquid within the first pipe section is reverse to a flowing direction of the liquid within the second pipe section.

5. The exposure apparatus according to claim 4, wherein a portion of the liquid circulates in the first pipe section and the second pipe section.

6. The exposure apparatus according to claim 1, further comprising:
    a temperature detection device that is provided at the first pipe section and measures a temperature of the liquid to be supplied onto the substrate.

7. The exposure apparatus according to claim 1, wherein the liquid supplying device is disposed at an external part of the exposure apparatus.

8. The exposure apparatus according to claim 1, wherein the liquid which has flowed through the second pipe section flows into a temperature control device that controls a temperature of the liquid.

9. The exposure apparatus according to claim 8, wherein the liquid which has flowed through the second pipe section flows into the temperature control device after a contaminant in the liquid is eliminated.

10. The exposure apparatus according to claim 1, further comprising:
    a nozzle section that supplies some of the liquid supplied by the liquid supplying device through the first pipe to form a liquid immersion region on a portion of an upper surface of the substrate, an area of the liquid immersion region being smaller than an area of the upper surface of the substrate.

11. An exposure method that exposes a substrate via a projection optical system and liquid, the method comprising:
    supplying the liquid, which is supplied from a liquid supplying device, between the projection optical system and the substrate via a first pipe section;
    controlling a temperature of the liquid flowing within the first pipe section by supplying the liquid from the liquid supplying device via a second pipe section surrounding an outside of the first pipe section; and
    exposing the substrate via the liquid of which the temperature is controlled.

12. The exposure method according to claim 11, wherein the liquid is supplied between the projection optical system and the substrate via a nozzle member connected to the first pipe section.

13. The exposure method according to claim 11, wherein the first pipe section is formed of resin.

14. The exposure method according to claim 11, wherein the second pipe section is formed of resin.

15. The exposure method according to claim 11, wherein a portion of the liquid which is not supplied between the projection optical system and the substrate flows within the second pipe section.

16. The exposure method according to claim 11, wherein a flowing direction of the liquid within the first pipe section is reverse to a flowing direction of the liquid within the second pipe section.

17. The exposure method according to claim 11, further comprising:
    measuring a temperature of the liquid flowing within the first pipe section.

18. The exposure method according to claim 11, wherein the liquid which has flowed through the second pipe section flows into a temperature control device that controls a temperature of the liquid.

19. The exposure method according to claim 18, wherein the liquid which has flowed through the second pipe section flows into the temperature control device after a contaminant in the liquid is eliminated.

20. An exposure apparatus that exposes a substrate via a projection optical system and liquid, the apparatus comprising:
- a first flow path that flows liquid supplied from a liquid supplying device; and
- a second flow path, at least a portion of the second flow path is disposed at an outside of at least a portion of the first flow path so that the portion of the first flow path is surrounded by and within the portion of the second flow path, wherein the second flow path also flows liquid supplied from the liquid supplying device.

21. The exposure apparatus according to claim 20, wherein a flowing direction of the liquid within the first flow path is reverse to a flowing direction of the liquid within the second flow path.

22. The exposure apparatus according to claim 21, wherein a portion of the liquid circulates in the first flow path and the second flow path.

23. The exposure apparatus according to claim 20, further comprising:
- a temperature detection device that is provided at the first flow path and measures a temperature of the liquid to be supplied onto the substrate.

24. The exposure apparatus according to claim 20, wherein the liquid supplying device is disposed at an external part of the exposure apparatus.

25. The exposure apparatus according to claim 20, wherein the liquid which has flowed through the second flow path flows into a temperature control device that controls a temperature of the liquid.

26. The exposure apparatus according to claim 25, wherein the liquid which has flowed through the second flow path flows into the temperature control device after a contaminant in the liquid is eliminated.

27. The exposure apparatus according to claim 20, further comprising:
- a nozzle section that supplies some of the liquid supplied by the liquid supplying device through the first flow path to form a liquid immersion region on a portion of an upper surface of the substrate, an area of the liquid immersion region being smaller than an area of the upper surface of the substrate.

28. An exposure method that exposes a substrate via a projection optical system and liquid, the method comprising:
- supplying the liquid, which is supplied from a liquid supplying device, between the projection optical system and the substrate via a first flow path;
- controlling a temperature of the liquid flowing within the first flow path by supplying the liquid from the liquid supplying device via a second flow path surrounding an outside of the first flow path; and
- exposing the substrate via the liquid of which the temperature is controlled.

29. The exposure method according to claim 28, wherein the liquid is supplied between the projection optical system and the substrate via a nozzle member connected to the first flow path.

30. The exposure method according to claim 28, wherein a portion of the liquid which is not supplied between the projection optical system and the substrate flows within the second flow path.

31. The exposure method according to claim 28, wherein a flowing direction of the liquid within the first flow path is reverse to a flowing direction of the liquid within the second flow path.

32. The exposure method according to claim 28, further comprising:
- measuring a temperature of the liquid flowing within the first flow path.

33. The exposure method according to claim 28, wherein the liquid which has flowed through the second flow path flows into a temperature control device that controls a temperature of the liquid.

34. The exposure method according to claim 33, wherein the liquid which has flowed through the second flow path flows into the temperature control device after a contaminant in the liquid is eliminated.

* * * * *